United States Patent
Watts

(10) Patent No.: US 8,227,682 B2
(45) Date of Patent: Jul. 24, 2012

(54) SAME PLANE MULTIPLE THERMOELECTRIC MOUNTING SYSTEM

(75) Inventor: Phillip C. Watts, Longmont, CO (US)

(73) Assignee: Watts Thermoelectric, LLC, Aspen, CO (US)

( * ) Notice: Subject to any disclaimer, the term of this patent is extended or adjusted under 35 U.S.C. 154(b) by 1251 days.

(21) Appl. No.: 10/823,353

(22) Filed: Apr. 13, 2004

(65) Prior Publication Data

US 2004/0206386 A1 Oct. 21, 2004

Related U.S. Application Data

(60) Provisional application No. 60/463,531, filed on Apr. 17, 2003.

(51) Int. Cl.
H01L 35/30 (2006.01)
H01L 35/28 (2006.01)

(52) U.S. Cl. .............. 136/205; 136/203; 62/3.2; 62/3.3; 62/259.2; 165/104.33

(58) Field of Classification Search ............... 123/263; 165/254, 104.33; 136/203, 205; 62/3.2, 62/3.3, 259.2

See application file for complete search history.

(56) References Cited

U.S. PATENT DOCUMENTS

| | | | | |
|---|---|---|---|---|
| 3,240,261 A | * | 3/1966 | Morales | 165/254 |
| 3,607,443 A | * | 9/1971 | Purdy | 136/202 |
| 3,607,444 A | * | 9/1971 | DeBucs | 136/208 |
| 3,899,359 A | | 8/1975 | Stachurski | |
| 3,989,547 A | * | 11/1976 | Purdy et al. | 136/205 |
| 4,011,104 A | * | 3/1977 | Basiulis | 136/205 |
| 4,095,998 A | * | 6/1978 | Hanson | 136/208 |
| 4,125,122 A | * | 11/1978 | Stachurski | 136/205 |
| 4,564,504 A | * | 1/1986 | Sorber | 422/189 |
| 4,753,682 A | * | 6/1988 | Cantoni | 136/212 |
| 4,802,929 A | | 2/1989 | Schock | |
| 5,228,923 A | * | 7/1993 | Hed | 136/208 |
| 5,322,042 A | * | 6/1994 | di Priolo et al. | 123/263 |
| 5,450,869 A | * | 9/1995 | Brittain et al. | 136/203 |
| 5,625,245 A | * | 4/1997 | Bass | 310/306 |
| 5,917,144 A | * | 6/1999 | Miyake et al. | 136/205 |
| 6,385,976 B1 | * | 5/2002 | Yamamura et al. | 62/3.7 |
| 6,410,971 B1 | * | 6/2002 | Otey | 257/467 |
| 6,759,586 B2 | | 7/2004 | Shutoh et al. | |
| 7,587,902 B2 | | 9/2009 | Bell | |
| 2004/0068991 A1 | | 4/2004 | Banney et al. | |

FOREIGN PATENT DOCUMENTS

WO WO 9743790 A1 11/1997
WO WO 03071198 A1 8/2003

* cited by examiner

Primary Examiner — Jennifer Michener
Assistant Examiner — Golam Mowla
(74) Attorney, Agent, or Firm — Kilpatrick Townsend & Stockton LLP

(57) ABSTRACT

This invention is intended to provide a mechanical building block system independent of mechanical tolerances of generator stack elements consisting of multiple parallel in plane elements that can be mass produced and mass assembled without sorting or lapping or machining in place. This implementation allows for simple maintenance of interchangeable unmatched parts.

27 Claims, 2 Drawing Sheets

Detail A

Detail A

SAME PLANE MULTIPLE THERMOELECTRIC MOUNTING SYSTEM

CROSS-REFERENCE TO RELATED APPLICATIONS

Provisional Patent Application NBR 60/463,531 filed Apr. 17, 2003.

STATEMENT REGARDING FEDERALLY SPONSORED RESEARCH OR DEVELOPMENT

Not applicable

REFERENCE TO A MICROFICHE APPENDIX

Not applicable

BACKGROUND OF THE INVENTION

Thermoelectric generators 136/200, 208 Plural junction subclass 205

BRIEF SUMMARY OF THE INVENTION

A mounting apparatus enabling multiple thermoelectric module configurations in the same plane to be assembled in parallel by removing the need to sort or match mechanical tolerances of the individual elements of the resultant stack of components. This system also includes heating and cooling chambers with mating self sealing connectors that are articulated in three planes so to be self aligning and remove the need for sorting, matching or lapping of individual elements that occupy the same mechanical plane of reference. The preferred embodiment of this invention enables any number of elements of the electricity generator to be mass assembled by reducing external heating and cooling fluidic connections as each element has self aligning fluidic input and output ports to adjacent modules of the same stack. This embodiment reduces physical connections, allows for mechanical thermal expansion and contraction in three axis while maintaining compression equally on all members of the parallel in plane stack of thermoelectric modules. This embodiment removes mechanical tolerance stack-up constraints between any element of the multiple in plane elements.

BRIEF DESCRIPTION OF THE SEVERAL VIEWS OF THE DRAWING

FIG. 1. depicts a view of the multiple thermoelectric modules mounted in the same plane sandwiched between two opposing cold fluidic blocks under spring compression with the heating fluidic block in the center.

FIG. 2. depicts a cut-away view of the multiple thermoelectric modules mounted in the same plane sandwiched between two opposing cold fluidic blocks under spring compression with the heating fluidic block in the center.

DETAILED DESCRIPTION OF THE INVENTION

This application pertains to removing the need to sort individual components that could consist of multiple elements configured in the same plane as a single system. The inherent design allows for the separation of air in the heating and cooling fluidic paths by feeding input fluids from the lowest point of the invention to the highest point of discharge of the invention. Fluid paths are mounted with a pronounced elevation of all exit paths from each element of the heating or cooling blocks. The required elevation is dependant on fluid velocity through the heating and cooling blocks. A base elevation of 15 degrees to 45 degrees from horizontal is the preferred configuration for fluid paths below one inch in diameter.

Figure 1:
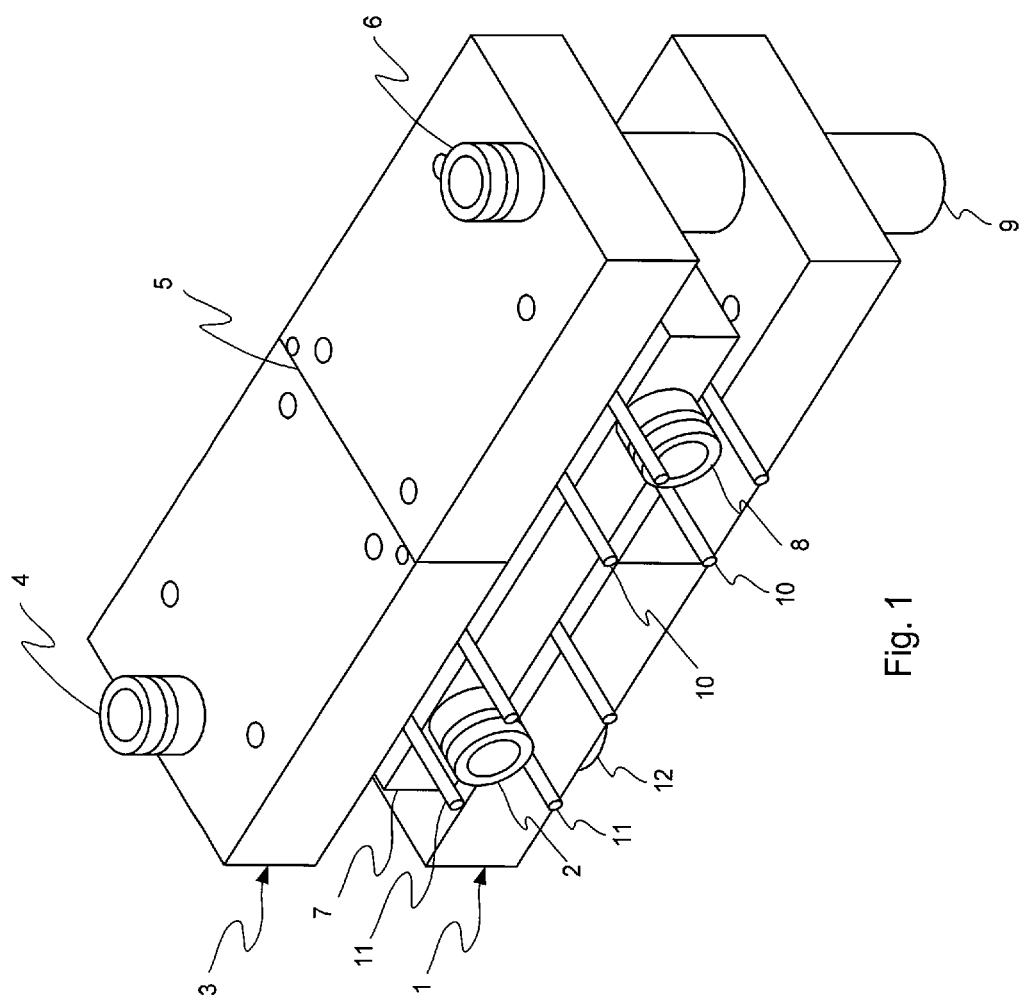
FIG. 1. Thermoelectrics mounted in same plane

Refer to FIG. 1 for the following description. Multiple fluids of different temperatures for circulating to and from external storage tanks or reservoirs cycle through opposing blocks of different fluid temperatures generate electricity within the thermoelectric modules. Cold blocks numbers 1 and 3, are in spring compression around hot block number 7. Electricity is generated in thermoelectric modules number 10 and number 11. Cold water enters via number 9 and exits number 12. Hot water enters via number 8 and exits from number 2 to return to a storage reservoir. The temperature difference between the hot and cold generates electricity. By circulating fluid from the low input ports of number 8 and number 9, air is transported out of the assembly to the exit ports number 2 for hot fluid and number 12 for cold fluid. Each cold block if bifurcated at number 5 which allows for not having to sort any stack element (thermoelectric modules or hot or cold blocks) for thickness dimensions. Cold ports number 4 and number 6 show detents for O-rings that allow for stack mechanical tolerance build up to be automatically compensated and removed while providing automatic compensation for thermal expansion and contraction. Any number of elements can be added to the stack by mounting the new element to the fluid input port number 6 and output fluid port number 4.

Figure 2:
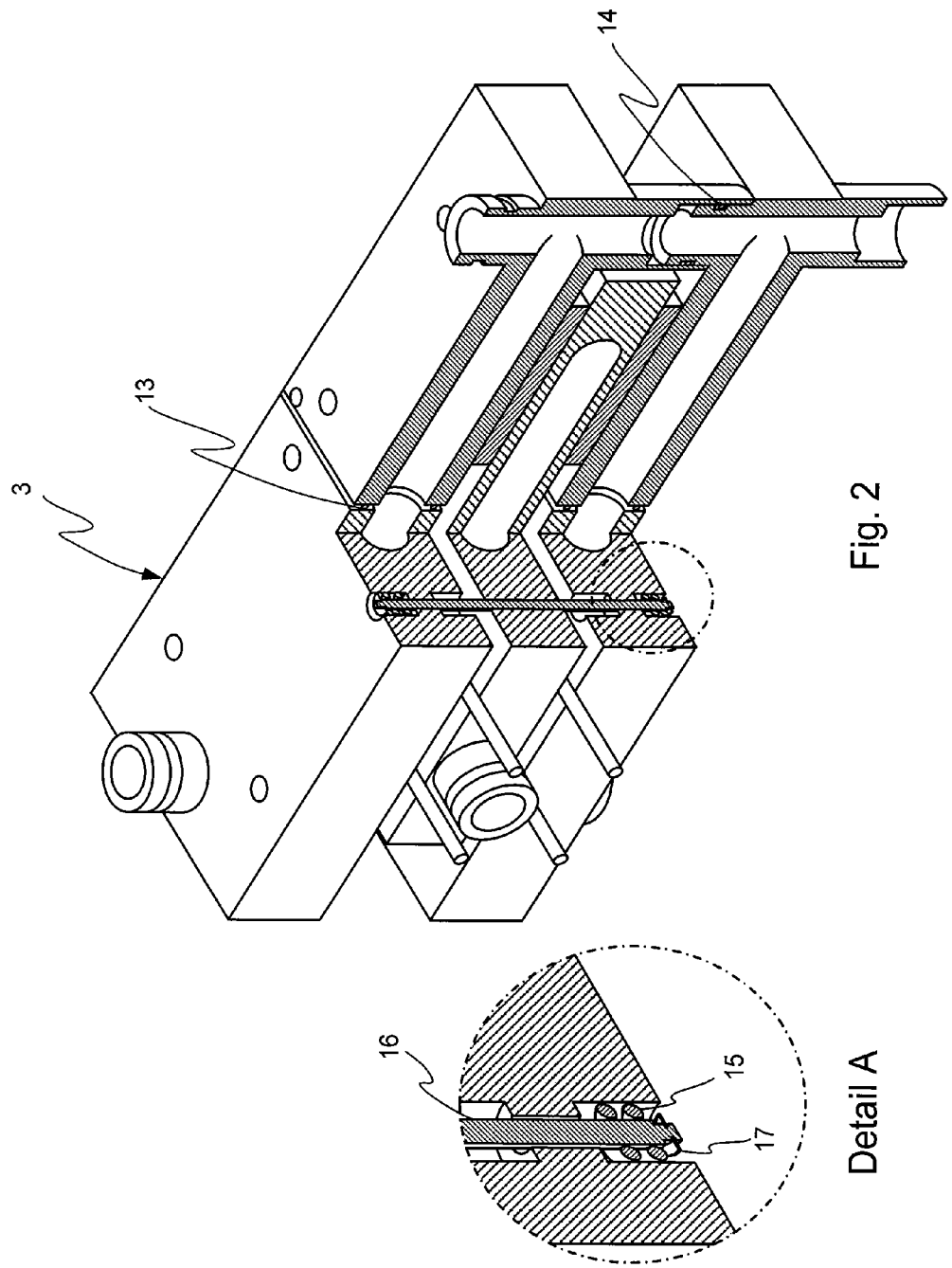
FIG. 2. Thermoelectrics mounted in same plane with cut-away view

Refer to FIG. 2 for the following description. Cold block 3 is bifurcated in the middle and has a dog leg feature that keeps adjacent blocks connected and applies pressure on o-ring 13. This feature eliminates multiple in plane sorting of thermoelectric modules and other stack elements. O-ring 14 also allows dimensional mechanical differences to be automatically adjusted to, eliminating sorting or lapping procedures. Compression on the total stack is shown in the detail 'A' enlargement. Spring 15 is held on to connecting rod 16 under compression, and further held in place by C-ring 17. This embodiment allows all axis expansion, contraction and natural mechanical variance in stack elements in multi-up configurations. This view shows a double opposed two multi-up thermoelectric module configuration. Any number of parallel in plane configurations can be constructed in this manner.

What I claim as my invention is:

1. A thermoelectric generator for generating electricity from a temperature differential between a first fluid and a second fluid, the thermoelectric generator comprising:
   a plurality of thermoelectric modules, wherein:
      each of the thermoelectric modules comprises a first side and a second side; and
      each of the thermoelectric modules generates electricity when there is a difference in temperature between the first side and the second side;
   a first thermal module, wherein:
      the first thermal module comprises a first block including a first passage through the first fluid flows through the first block; and
      the first thermal module is configured to exchange heat with the first sides of at least two of the plurality of thermoelectric modules; and
   a plurality of second thermal modules, wherein:

each of the plurality of second thermal modules comprises a respective second block including a respective second passage through which the second fluid flows through the respective second block; and a side of each of the second thermal modules is configured to exchange heat with exactly one of the thermoelectric modules through the second side of the respective thermoelectric module;

at least two of the plurality of second thermal modules reside on one side of the first thermal module, both of their respective thermoelectric modules being in contact with one planar face of the first thermal module;

the two second thermal modules that are on one side of the first thermal module are flexibly coupled to each other; and each of the second thermal modules accommodates all axis mechanical variance in its respective thermoelectric module.

2. The thermoelectric generator for generating electricity from the temperature differential between the first fluid and the second fluid of claim 1, wherein the thermoelectric generator further comprises:

a compression mechanism, wherein the compression mechanism is operably coupled with two of the plurality of second thermal modules such that the first thermal module and at least one of the plurality of thermoelectric modules is compressed between two of the plurality of second thermal modules.

3. The thermoelectric generator for generating electricity from the temperature differential between the first fluid and the second fluid of claim 2, wherein:

the compression mechanism comprises a rod and a spring.

4. The thermoelectric generator for generating electricity from the temperature differential between the first fluid and the second fluid of claim 2, wherein:

the compression mechanism is configured to compress with an actively variable force.

5. The thermoelectric generator for generating electricity from the temperature differential between the first fluid and the second fluid of claim 2, wherein:

the compression mechanism is configured to compensate for thermal expansion and thermal contraction of at least one of the plurality of second thermal modules.

6. The thermoelectric generator for generating electricity from the temperature differential between the first fluid and the second fluid of claim 2, wherein:

the compression mechanism is configured to compensate for stack tolerance build-up of the plurality of second thermal modules.

7. The thermoelectric generator for generating electricity from the temperature differential between the first fluid and the second fluid of claim 1, wherein;

at least one of the plurality of second thermal modules is compliantly coupled with at least one other of the plurality of second thermal modules.

8. The thermoelectric generator for generating electricity from the temperature differential between the first fluid and the second fluid of claim 7, wherein at least one of the plurality of second thermal modules being compliantly coupled with at least one other of the plurality of second thermal modules comprises:

at least one of the plurality of second thermal modules compliantly coupled with at least one other of the second thermal modules, allowing all axis expansion, contraction and natural mechanical variance in elements of a stack comprising at least one of the plurality of thermoelectric modules.

9. The thermoelectric generator for generating electricity from the temperature differential between the first fluid and the second fluid of claim 7, wherein at least one of the plurality of second thermal modules being compliantly coupled with at least one other of the plurality of second thermal modules comprises:

at least one of the plurality of second thermal modules being coupled via an o-ring slip joint with at least one other of the plurality of second thermal modules.

10. The thermoelectric generator for generating electricity from a temperature differential between a first fluid and a second fluid as recited in claim 1, wherein the first fluid is at a higher temperature than the second fluid.

11. The thermoelectric generator for generating electricity from a temperature differential between a first fluid and a second fluid as recited in claim 1, wherein the first fluid and the second fluid are received from external storage reservoirs.

12. The thermoelectric generator for generating electricity from a temperature differential between a first fluid and a second fluid as recited in claim 1, wherein the first fluid and the second fluid circulate to and from external storage reservoirs.

13. The thermoelectric generator for generating electricity from a temperature differential between a first fluid and a second fluid as recited in claim 1, further comprising an inlet through which the second fluid is received for distribution to all of the second thermal modules.

14. The thermoelectric generator for generating electricity from a temperature differential between a first fluid and a second fluid as recited in claim 1, wherein both fluids are liquids.

15. The thermoelectric generator for generating electricity from a temperature differential between a first fluid and a second fluid as recited in claim 14, wherein both liquids comprise water.

16. The thermoelectric generator for generating electricity from a temperature differential between a first fluid and a second fluid as recited in claim 1, wherein the first thermal module is rectangular.

17. The thermoelectric generator for generating electricity from a temperature differential between a first fluid and a second fluid as recited in claim 1, wherein each of the second thermal modules is rectangular.

18. The thermoelectric generator for generating electricity from a temperature differential between a first fluid and a second fluid as recited in claim 1, wherein the two second thermal modules that are on one side of the first thermal module are flexibly coupled to each other such that the second fluid flows through the respective second passages of both of the second thermal modules that are on one side of the first thermal module.

19. The thermoelectric generator for generating electricity from a temperature differential between a first fluid and a second fluid as recited in claim 18, further comprising a compliant member that seals between the two respective second passages.

20. A thermoelectric generator for generating electricity from a temperature differential between a first fluid and a second fluid, the thermoelectric generator comprising:

a plurality of thermoelectric modules, wherein:
each of the thermoelectric modules comprises a first side and a second side; and
each of the thermoelectric modules generates electricity when there is a difference in temperature between the first side and the second side;

a first thermal module, wherein:

the first thermal module comprises a first block including a first passage through which the first fluid flows through the first block; and
the first thermal module is configured to exchange heat with the first sides of at least two of the plurality of thermoelectric modules;
a plurality of second thermal modules, wherein:
each of the plurality of second thermal modules comprises a respective second block including a respective second passage through which the second fluid flows through the respective second block; and
a side of each of the second thermal modules is configured to exchange heat with exactly one of the thermoelectric modules through the second side of the respective thermoelectric module;
at least two of the plurality of second thermal modules reside on one side of the first thermal module, both of their respective thermoelectric modules being in contact with one planar face of the first thermal module; and
each of the second thermal modules accommodates all axis mechanical variance in its respective thermoelectric module; and
a compliant member between the two second thermal modules that are on one side of the first thermal module, and a mechanism that connects the two second thermal modules and applies pressure to the compliant member.

21. The thermoelectric generator for generating electricity from a temperature differential between a first fluid and a second fluid as recited in claim 20, wherein the mechanism is a dogleg feature.

22. The thermoelectric generator for generating electricity from a temperature differential between a first fluid and a second fluid as recited in claim 1, wherein at least two of the plurality of second thermal modules reside on a second side of the first thermal module, both of their respective thermoelectric modules being in contact with a second planar face of the first thermal module.

23. A thermoelectric generator for generating electricity from a temperature differential between a first fluid and a second fluid, the thermoelectric generator comprising:
a plurality of thermoelectric modules, wherein:
each of the thermoelectric modules comprises a first side and a second side; and
each of the thermoelectric modules generates electricity when there is a difference in temperature between the first side and the second side;
a first thermal module, wherein:
the first thermal module comprises a first block including a first passage through which the first fluid flows through the first block; and
the first thermal module is configured to exchange heat with the first sides of at least two of the plurality of thermoelectric modules;
a plurality of second thermal modules, wherein:
each of the plurality of second thermal modules comprises a respective second block including a respective second passage through which the second fluid flows through the respective second block; and
a side of each of the second thermal modules is configured to exchange heat with exactly one of the thermoelectric modules through the second side of the respective thermoelectric module; and
each of the second thermal modules accommodates all axis mechanical variance in its respective thermoelectric module; and a compression mechanism that includes a rod, wherein the rod passes through the first thermal module without encountering the first passage, and wherein the rod passes through at least one of the second thermal modules without encountering any second passage.

24. The thermoelectric generator for generating electricity from the temperature differential between the first fluid and the second fluid of claim 1, wherein:
the first block is rectangular; and
each second block is rectangular.

25. A thermoelectric generator for generating electricity from a temperature differential between a first fluid and a second fluid, the thermoelectric generator comprising:
a plurality of thermoelectric modules, wherein:
each of the thermoelectric modules comprises a first side and a second side; and
each of the thermoelectric modules generates electricity when there is a difference in temperature between the first side and the second side;
a first thermal module, wherein:
the first thermal module comprises a first block including a first passage through which the first fluid flows through the first block; and
the first thermal module is configured to exchange heat with the first sides of at least two of the plurality of thermoelectric modules; and
a plurality of second thermal modules, wherein:
each of the plurality of second thermal modules comprises a respective second block including a respective second passage through which the second fluid flows through the respective second block; and
a side of each of the second thermal modules is configured to exchange heat with exactly one of the thermoelectric modules through the second side of the respective thermoelectric module; and
each of the second thermal modules accommodates all axis mechanical variance in its respective thermoelectric module; and
wherein the first fluid enters and exits the first thermal module via the same face of the first thermal module.

26. A thermoelectric generator for generating electricity from a temperature differential between a first fluid and a second fluid, the thermoelectric generator comprising:
four thermoelectric modules, wherein:
each of the thermoelectric modules comprises a first side and a second side; and
each of the thermoelectric modules generates electricity when there is a difference in temperature between the first side and the second side;
a first thermal module, wherein:
the first thermal module comprises a first passage through which the first fluid flows through the first thermal module; and
the first thermal module is configured to exchange heat with the first sides of the four thermoelectric modules, two of the four thermoelectric modules being in contact with a first side of the first thermal module, and two of the four thermoelectric modules being in contact with a second side of the first thermal module opposite the first side of the first thermal module; and
a plurality of second thermal modules, wherein:
each of the plurality of second thermal modules comprises a respective second passage through which the second fluid flows through the respective second thermal module; and
a side of each of the second thermal modules is configured to exchange heat with exactly one of the thermoelectric modules through the second side of the respective thermoelectric module; and wherein at least some of the second fluid flows from an inlet, through a first one of the second thermal modules on the first side of the first thermal module, then through a second one of the second thermal modules on the first side of the first thermal module, and then to an outlet, and wherein the first one of the second thermal modules and the second one of the second thermal modules are flexibly coupled together;

and wherein the first fluid enters and exits the first thermal module via the same face of the first thermal module.

27. A thermoelectric generator for generating electricity from a temperature differential between a first fluid and a second fluid, the thermoelectric generator comprising:

an input fluid port;

an output fluid port;

a first thermal module;

a plurality of second thermal modules, each having a respective passage therethrough, through which a fluid can flow through the respective second thermal module; and a plurality of thermoelectric modules; wherein:

each of the plurality of thermoelectric modules has a least one face in contact with the first thermal module;

each of the plurality of second thermal modules has a respective face in contact with exactly one of the thermoelectric modules, such that each thermoelectric module is sandwiched between the first thermal module and a respective one of the second thermal modules;

a first pair of the second thermal modules is disposed on a first side of the first thermal module such that their respective passages align, such that the fluid can pass from the inlet fluid port, through the first pair of second thermal modules in series, and to the outlet fluid port; and a second pair of the second thermal modules is disposed on a second side of the first thermal module opposite the first side of the first thermal module, such that the fluid can pass from the inlet fluid port, through the second pair of second thermal modules in series, and to the outlet fluid port.

* * * * *